(12) United States Patent
Bratt et al.

(10) Patent No.: US 7,143,324 B2
(45) Date of Patent: Nov. 28, 2006

(54) SYSTEM AND METHOD FOR AUTOMATIC MASKING OF COMPRESSED SCAN CHAINS WITH UNBALANCED LENGTHS

(75) Inventors: John T. Bratt, Fort Collins, CO (US); Jeffrey R. Rearick, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 188 days.

(21) Appl. No.: 10/980,961

(22) Filed: Nov. 4, 2004

(65) Prior Publication Data

US 2006/0095818 A1 May 4, 2006

(51) Int. Cl.
*G01R 31/28* (2006.01)

(52) U.S. Cl. ............... 714/726; 714/732; 714/738

(58) Field of Classification Search ............... None
See application file for complete search history.

(56) References Cited

U.S. PATENT DOCUMENTS

| 6,346,822 B1 * | 2/2002 | Nishikawa ............... 326/16 |
| 6,543,018 B1 * | 4/2003 | Adusumilli et al. ......... 714/729 |
| 7,058,869 B1 * | 6/2006 | Abdel-Hafez et al. ...... 714/729 |

* cited by examiner

*Primary Examiner*—Christine T. Tu (57) ABSTRACT

A scan test architecture is implemented. The scan test architecture provides a method of performing scan test of unbalanced scan chains. The scan test architecture generates a control signal (i.e., masking signal) to mask bits in an unbalanced scan chain. In one embodiment, the control signal is generated with a logic gate, a comparator, and a counter.

15 Claims, 8 Drawing Sheets

Fig. 1

PRIOR ART

Fig. 2

PRIOR ART

SYSTEM AND METHOD FOR AUTOMATIC MASKING OF COMPRESSED SCAN CHAINS WITH UNBALANCED LENGTHS

FIELD OF THE INVENTION

This invention relates to electronics systems. Specifically, the present invention relates to electronic system testing.

DESCRIPTION OF THE RELATED ART

Scan tests are implemented to test faulty circuit behavior, such as behavior caused by manufacturing defects in digital logic based devices. For example, modern microprocessors are implemented using tens of millions of logic gates. Scan tests are used to test the logic gates for faults.

In a conventional scan test, a test pattern is generated to test a prospective device. The test pattern may include a sequence of zeros and ones defined to test various logic gates. An automated test pattern generator (ATPG) is typically used to generate the test pattern. The ATPG analyzes a circuit model (i.e., called a netlist) of a digital logic based device such as a microprocessor (i.e., chip) and identifies a set of potential fault locations or sites on the chip. The ATPG then generates the test patterns necessary to test the fault sites.

Storage elements (i.e., flip-flops) on the device are connected serially during scan test operations into a scan chain or scan chain segment. The test pattern is often generated in a one-to-one relationship with the scan chain segment. For example, if the scan chain is 10 flip-flops long the test pattern may be generated with 10 bits, one bit associated with each flip-flop.

The test pattern is introduced through an input data pin. The test pattern is shifted into the scan chain segment serially, one bit per clock cycle. After a selected number of capture clock cycles, the resulting state of the test is then shifted out through an output pin. As the test pattern is shifted out of the scan chain segment, another test pattern is shifted into the scan chain segment. Each test pattern is generated with the intention of discovering faults in the logic surrounding the flip-flops in the scan chain segment. Therefore, the ATPG generates patterns that will place specific states on the flip-flops in the scan chain so that targeted faults in the surrounding logic can be identified.

Modern architectures include a tremendous amount of logic and gates that need to be tested. Although an attempt is made to test all of the gates in a modern architecture, for technical reasons, typically less than 100% of the gates can be tested. However, in spite of this, because of the large number of gates in modern architectures, a tremendous amount of data is generated with each test and a substantial number of test patterns have to be generated to properly test a device. For example, ATPG programs may run for weeks to create test patterns for large, complex circuits.

Since the flip-flops are connected in a serial chain and each bit in the test pattern is shifted into the scan chain at the rate of one bit per clock cycle, when there are tens of millions of bits, it takes a substantial amount of time to shift the test patterns into the scan chain. The cost of performing the scan chain test is directly proportional to the amount of time required to perform the test. As a result, a number of techniques have been developed to attempt to optimize the time and lower the cost associated with scan chain testing.

In addition, the complexity of chips (i.e., ASICs) is increasing. As the complexity of ASICs increases, the number of flip-flops, and thus the associated scan test length, also increases. Further, ASIC architectures include additional technologies, such as Serializer/De-serializers (SERDES). Additional technologies, such as the SERDES, tend to reduce the number of I/O pins available for inputting and outputting the test pattern. These two factors combine to increase the number of clock cycles needed to perform scan test. As a result of the fewer, longer scan chains, the cost of the scan test increases.

To reduce the test time and cost, a variety of conventional scan compression techniques have been developed. In these scan compression techniques, a test pattern is decompressed on chip after being input, used to perform a scan test, and then the response is compressed on chip before being output. As a result, although limited input/output pins are available, a large variety of test patterns can be generated to test the targeted faults in a limited amount of time.

Figure 1:
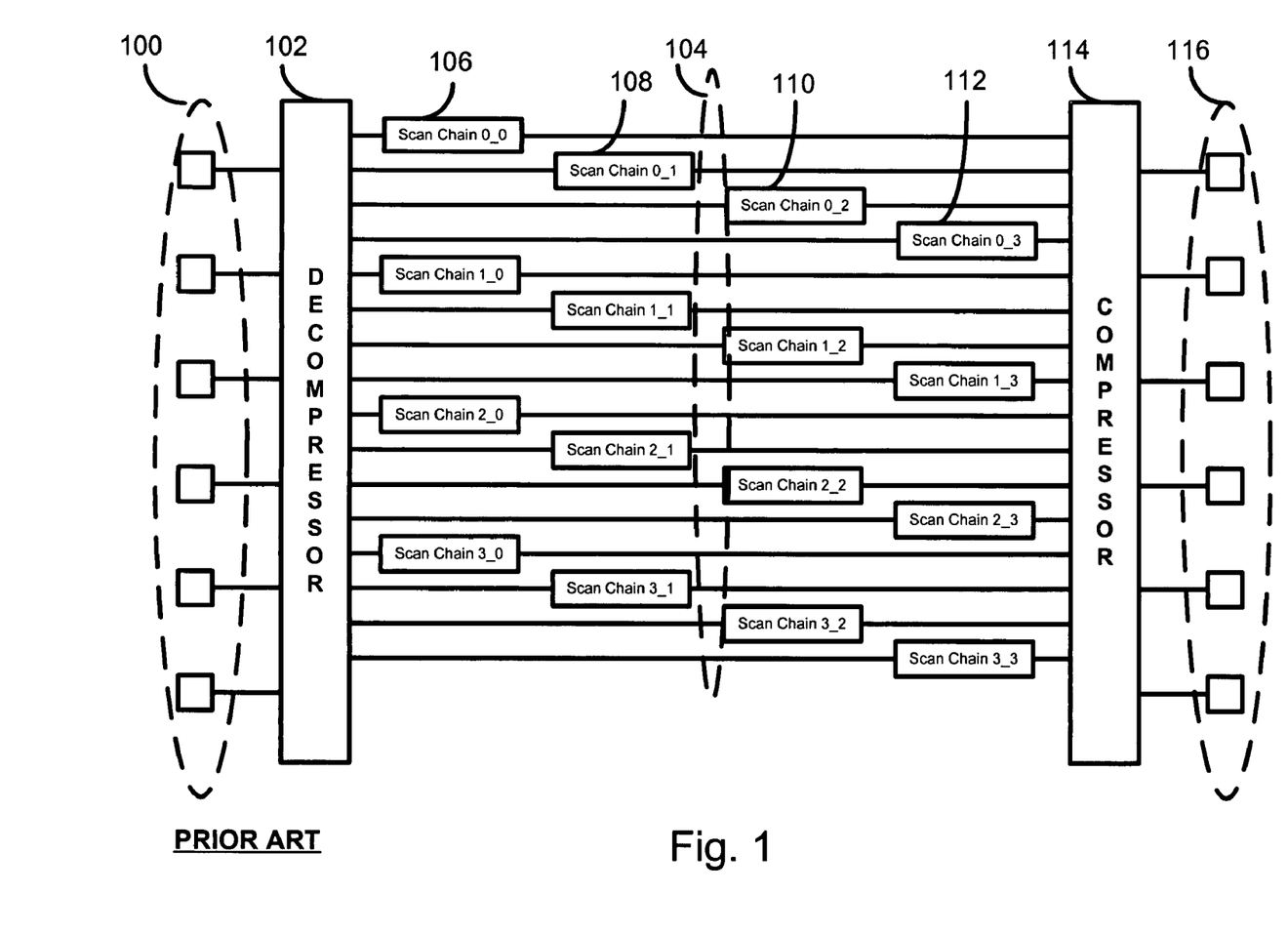
FIG. 1 displays a prior art scan chain architecture.

FIG. 1 depicts a prior art scan chain architecture. The scan chain architecture includes a decompressor and a compressor, as shown by 102 and 114, respectively. The decompressor 102 connects S1 scan channels 100 from the outside world to S2 scan segments 104, where S2>S1. As scan data (i.e., test patterns) is shifted into the scan chain architecture, the decompressor 102 uses methods to generate a larger number of outputs (i.e., 106, 108, 110, 112). Likewise, the compressor 114 compresses the outputs (i.e., 106, 108, 110, 112) shifted out of the scan segments 104 and produces a result that is used to determine the success or failure of the scan test. This result is shifted out of the scan chain architecture on S3 scan channels 116, where S3<S2. For example, in one embodiment, S1 may include 6 scan channels 100, S2 may include 16 scan channels 104, and S3 may include 6 scan channels 116.

A simple scan chain architecture may be implemented with a simple decompressor and a simple compressor. For example, an input with a fanout larger than 1 may be implemented as a simple decompressor. Using the fanout, as data is shifted into the chip, the data is replicated into more than one scan chain segment. When shifting is complete, all of the scan chain segments will contain the same values. Other more complicated decompression schemes are also available.

Compressors may be implemented with parity checks, signature registers, checksums, etc. A simple compressor may be implemented with a multi-input XOR tree, which implements a parity check on each successive set of bits as the bits are shifted out of multiple scan chain segments. More complicated compressors include compression schemes that receive the bits shifted out of the scan segments to produce signature values or checksums. In all of these simple compression schemes, a bit with an unpredictable value (an X) that is shifted out of a segment will render the result of the compressor meaningless, as it becomes impossible to know whether the result is correct or incorrect due to the unpredictable value.

In one conventional scan chain architecture that implements compressed scan chains, the same scan data source (i.e., input bits coming from the tester) is input into the start of multiple short scan chains. As a result, when the scan chain segments are the same length, the bits in the scan data source are processed through the scan chain segments at the same rate.

The ideal scan chain architecture includes S2 segments, all containing exactly N flops. This may be referred to as a balanced scan chain architecture. When all of the scan chain segments are the same length (i.e., balanced scan chain architecture), it is possible to shift out a result of a previous test pattern from the scan chain segment as you shift the next test pattern into the scan chain segment. For example, in a scenario where a scan chain segment is implemented with 5 flip-flops (i.e., 5 flip-flops long), at the end of 5 shifts, a result from the entire previous test pattern is computed as the next test pattern is shifted in.

In practice, it is nearly impossible to achieve a balanced scan chain architecture due to imbalances inherent in the physical partitioning of the circuit being scanned. Instead, at least one segment in the group will be short, with a length of N–M. A scan chain architecture including scan chain segments of different lengths is referred to as an unbalanced scan chain architecture.

In unbalanced scan chains, the scan chain segments are not the same length. For example, one scan chain segment may be 5 flip-flops long (i.e., longer chain) and a second scan chain segment may be 3 flip-flops long (i.e., shorter chain). Therefore, two additional bits have to be accounted for at the end of the 3 flip-flop scan chain segment in order to produce a predictable result. In the unbalanced case, you have to perform 5 shifts to exercise the longer chain, but shifts 4 and 5 produce potentially ambiguous results from the end of the 3 flip-flop chain. The ambiguous data at shifts 4 and 5 make the results of the compressor meaningless.

Figure 2:
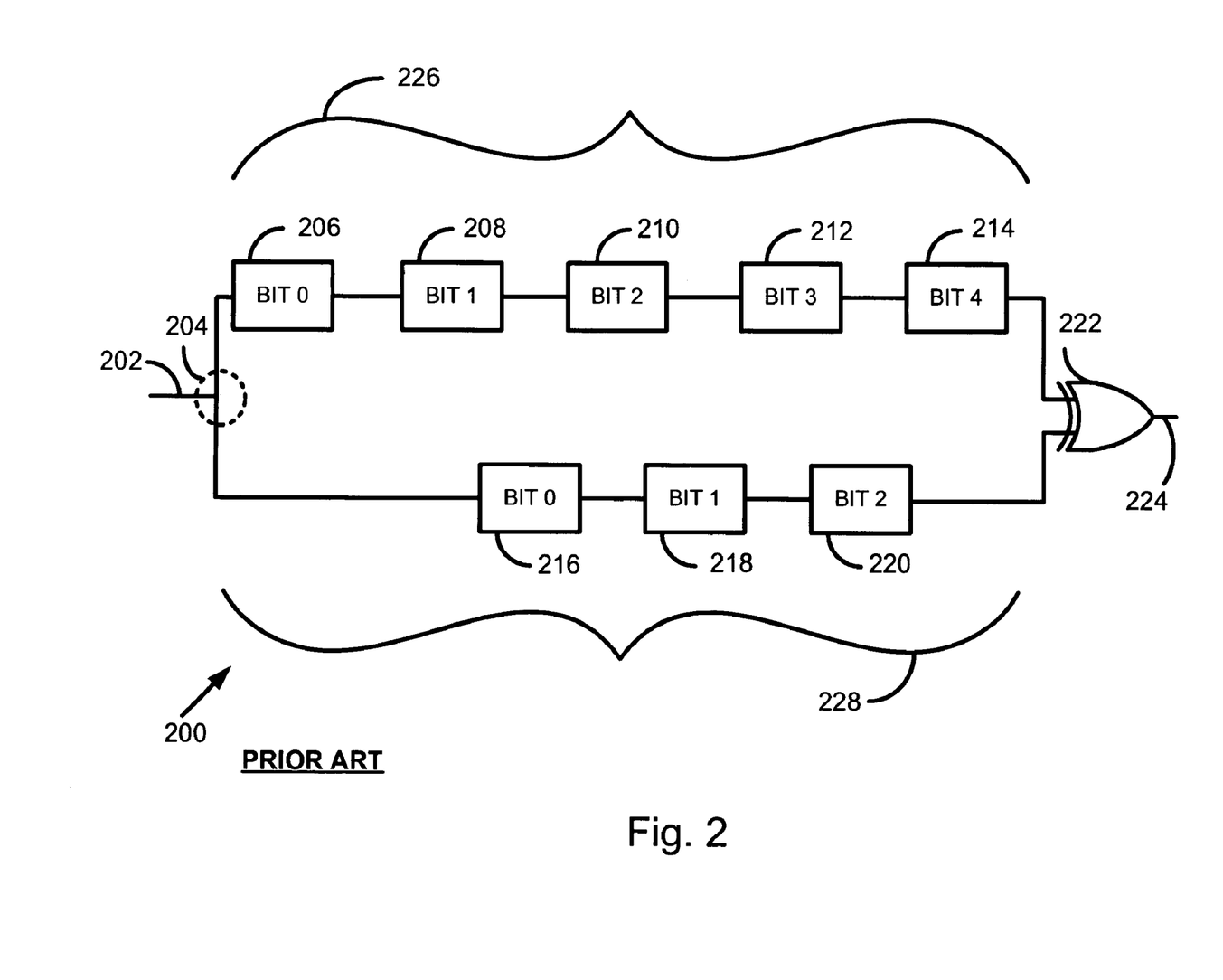
FIG. 2 displays a prior art scan chain architecture implemented with a simple decompressor and compressor.

FIG. 2 displays a prior art scan chain architecture implemented with a simple decompressor and compressor. FIG. 2 displays a prior art scan chain architecture 200 with unbalanced scan chain segments. In FIG. 2, an incoming pattern (input) is applied at the scan data input shown as 202. A simple decompressor (a fanout) is shown as 204. Scan chain segments 226 and 228 are shown. Scan chain segment 226 comprises a 5 flip-flop scan chain segment, which includes Bit position 0 shown as 206, Bit position 1 shown as 208, Bit position 2 shown as 210, Bit position 3 shown as 212, and Bit position 4 shown as 214. Scan chain segment 228 comprises a 3 flip-flop scan chain segment, which includes Bit position 0 shown as 216, Bit position 1 shown as 218, and Bit position 2 shown as 220.

A compressor is implemented with XOR gate 222, which then produces an output 224. The scan chain architecture 200 represents an unbalanced scan chain architecture since the scan chain segment shown as 226 has a different length (i.e., 5 flip-flops) from the length (i.e., 3 flip-flops) of the scan chain segment shown as 228.

In the scan chain architecture 200, data (i.e., a test pattern) is shifted into the scan chain architecture 200 at input 202. The data is then separated into the individual scan chain segments (i.e., 226, 228) at a fanout 204. The longer scan chain segment (scan chain segment 226) is of length N (i.e., 5 flip-flops). The shorter scan chain segment (i.e., scan chain segment 228) is of length N–M, which makes the shorter scan chain segment M flops shorter than the long one. In this example, N is 5 and M is 2. Scan chain segment 226 has N flip-flops (i.e., 5) and scan chain segment 228 has N–M flip-flops (i.e., 3).

In a conventional method, a bit stored in Bit position 4 (214) and a bit stored in Bit position 2 (220) are combined (i.e., compressed) in the XOR gate 222 after the first shift. A bit stored in Bit position 3 (212) and a bit stored in Bit position 1 (218) are combined in the XOR gate 222 after the second shift. A bit stored in Bit position 2 (210) and a bit stored in Bit position 0 (216) are combined in the XOR gate 222 after the third shift. However, when it is time to combine a bit stored in Bit position 1 (208), there is no comparable bit position in scan chain segment 228. Since the next pattern is being shifted in as the first pattern is being shifted out, the first bit of the next pattern (not shown) is combined with a bit stored in Bit position 1 (208) and the second bit of the next pattern is combined with a bit stored in Bit position 0 (206). The last two combinations (i.e., which use the next pattern) may result in unknown states.

A number of techniques have been developed for addressing the problems associated with unbalanced scan chain segments. Specifically, there are four methods presented for addressing the problems of unbalanced scan chain segments: 1) shift in a pattern by itself without overlapping the scan-out of this pattern with the scan-in of the next pattern; 2) make the order of the patterns fixed; 3) padding the pattern with a correct number of known values; and 4) make the order of the pattern fixed and track information.

In a first method, each pattern is shifted in by itself. Specifically, a first pattern is shifted in, a test is applied, and the result is shifted out. Instead of immediately shifting in the next pattern, zeros (or some other deterministic set of values) are shifted in as you shift out the first pattern. This makes each test a completely independent exercise. However, this technique also doubles the tester time needed to perform the test.

In a second method, the order of the patterns is fixed. To implement this approach, you account for the effect of the next pattern (i.e., a known value) on the compressor result from the previous test. However, this approach makes initial chip turn-on or debugging more difficult. Either the whole suite of tests needs to be performed every time, or a set of effectively redundant vectors (i.e., with padding or for individual use) must be generated. An individual pattern may not be arbitrarily dropped from the test set, since the following pattern depends on it.

In a third method, the patterns are padded with the correct number of known values (i.e., usually zeros for simplicity) to prevent the next pattern from having an effect on the compressor. This is essentially the same as the first method with unnecessary shifting eliminated. However, this approach increases tester time and cost, though not as much as in the first method.

Table I given below provides a tabular form of the prior art padding technique. The data in Table I is associated with the scan chain architecture detailed in FIG. 2. In Table I, PN represents a bit of the next incoming pattern. RN,M is the result of the previous test in bit M of scan chain N. It should be noted that in the example, provided in Table I, the output at time 7 is not relevant until after the next pattern (i.e., P4 to P0) is applied.

TABLE I

| | TIME | | | | | | | |
|---|---|---|---|---|---|---|---|---|
| | 0 | 1 | 2 | 3 | 4 | 5 | 6 | 7 |
| Chain 1 | | | | | | | | |
| Bit 0 | R1,0 | 0 | 0 | P4 | P3 | P2 | P1 | P0 |
| Bit 1 | R1,1 | R1,0 | 0 | 0 | P4 | P3 | P2 | P1 |
| Bit 2 | R1,2 | R1,1 | R1,0 | 0 | 0 | P4 | P3 | P2 |
| Bit 3 | R1,3 | R1,2 | R1,1 | R1,0 | 0 | 0 | P4 | P3 |
| Bit 4 | R1,4 | R1,3 | R1,2 | R1,1 | R1,0 | 0 | 0 | P4 |
| Chain 2 | | | | | | | | |
| Bit 0 | R2,0 | 0 | 0 | P4 | P3 | P2 | P1 | P0 |
| Bit 1 | R2,1 | R2,0 | 0 | 0 | P4 | P3 | P2 | P1 |
| Bit 2 | R2,2 | R2,1 | R2,0 | 0 | 0 | P4 | P3 | P2 |
| Output | R1,4⊕R2,2 | R1,3⊕R2,1 | R1,2⊕R2,0 | R1,1⊕0 | R1,0⊕0 | Don't Care | Don't Care | |

Reviewing Table I, at time 0, Bit position 4 of scan chain 1 shown as 214 of FIG. 2 will store R1,4, which is the result of the previous test in bit 1 of scan chain 4. At time 0, Bit position 2 of scan chain 2 shown as 220 of FIG. 2 will store R2,2, which is the result of the previous test in bit 2 of scan chain 2. The output shown as 224 of FIG. 2 will include R1,4 XOR R2,2 at time 0. It should also be noted that at various times, a bit value of zero is shifted in to pad the respective scan chains. For example, since a fanout—based compressor implementation is used, at time 1 and 2, a zero is shifted into Bit position 0 of chain 1. At time 1 and 2, a zero is also shifted into Bit position 0 of chain 2. These two zeros make the outputs at time 3 and 4 independent of the order of the patterns P0 through P4, which is the overall purpose of the padding technique. In addition, it should be noted that at time 5 and 6, as a result of the padding, the compressor XOR output is the "don't care" value.

The fourth method is an extension of the second method. As mentioned with the second method, you account for the effect of the next pattern (i.e., a known value) on the compressor result from the previous test. You then track sufficient information about how the next pattern will affect a result so that you can reorder the sequence of test patterns and recalculate the correct result. However, this approach makes the ATPG tool more complicated, and if reordering the tests becomes necessary, the user has to return to the ATPG tool to update the expected results.

As a result of the shortcomings of the foregoing methods, there is a need for a method and apparatus for performing scan test in unbalanced scan chains.

SUMMARY OF THE INVENTION

The present invention is directed to a method of performing scan test in unbalanced scan chains. An architecture is implemented for generating a control signal to mask bits in an unbalanced scan chain. In one embodiment, the architecture includes a counter, a comparator, and a logic gate.

In one embodiment, control signals are generated to perform masking. The control signals are produced with specific components. The first component is a counter capable of counting to N, where N is the number of flip-flops in the longest scan chain segment on a chip. In one embodiment, the counter is automatically reset each time the chip is clocked in functional mode. In other words, the counter begins counting clock cycles when scan-mode is enabled. Thus, each time a pattern is shifted in, the counter starts at zero and counts the number of test bits shifted into the chip. After shifting is completed and the chip is placed in normal operation mode, the counter is reset to zero. In an alternative embodiment, the counter is capable of counting to N–M and holding this maximum value until reset to zero.

A second component includes logic that performs a "count" > N–M comparison, where "count" represents the number on the counter and N–M represents the number of flip-flops in a shorter scan segment. When the value of the counter reaches N–M, a control line is toggled. Asserting a control signal on the control line masks the bits at the end of the short scan segment.

In one embodiment, when multiple control signals are required, logic is implemented to perform multiple different comparison operations relative to the value of the counter. The value or multiple values, if multiple control signals are needed, may be hard-coded in the chip or loaded into non-volatile registers as an initialization step prior to the start of the scan test.

After a test has been performed, the counter will be set to zero and the control line will unmask the short scan segment. This allows all scan segments (i.e., including the short scan segment) to output the first N–M bits into the compressor. A control signal is then asserted to mask the output of the short segment. A further M shifts are performed to complete the observation of the longer scan chain segments and to finish shifting the new pattern. During these shifts, the compressor receives only zeros (or some other deterministic, pre-selected series of bits—zeros will be used as illustration) at the end of the short scan chain segment. Finally, the counter is reset and the process begins again for the next pattern.

In one embodiment, the counter is implemented as physical hardware on a chip. If duplicating the counter is convenient for physical reasons (i.e., routing lengths on the chip, for instance), duplicate counters may be implemented. A comparator may be implemented with a variety of different methods and a logic gate is also implemented. In one embodiment, the logic gate is implemented as a masking gate for each short scan segment. The comparator controls this gate. If multiple short scan segments exist that are the same length, they can share the comparator, but each must have its own masking gate.

In another embodiment, a counter is implemented on a chip. As a test pattern is shifted into the chip, the counter counts each shift. The counter may be implemented in hardware, software, etc. At least one comparator is connected to each counter. After the correct number of shifts (i.e., the length of the segment that the comparator is associated with), the comparator asserts an output in the appropriate direction. When the comparator asserts the output, the bits at the end of the short scan chain segment get masked off so that the compressor does not receive them (i.e., the compressor just receives zeros). The net result is that zeros that are required for input into the compressor are provided without adding zeros to the beginning of the next pattern (i.e., padding).

In another embodiment, a gate, a comparator, and a counter are implemented. The counter may be shared across the entire scan chain architecture. A comparator is implemented for each different length of short segment that needs to be masked. In one embodiment, M extra bits that shift out of the short scan chain segment are eliminated and restricted from propagating into the compressor. In one embodiment of the present invention, this is accomplished by including a gate between the end of the short segment and the compressor. A control input to the gate is adjusted after N–M bits have been shifted out of the short scan chain segment. The control input masks the M extra bits. This ensures that the compressor receives only zeros for those M cycles. Receiving zeros for M cycles simulates the effect of the padding bits without the extra padding bits being supplied by the tester. It should be appreciated that the control signal input to the mask needs to be produced either on-chip or by the tester. Thus, multiple different control signals may be implemented to perform the masking.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 3:
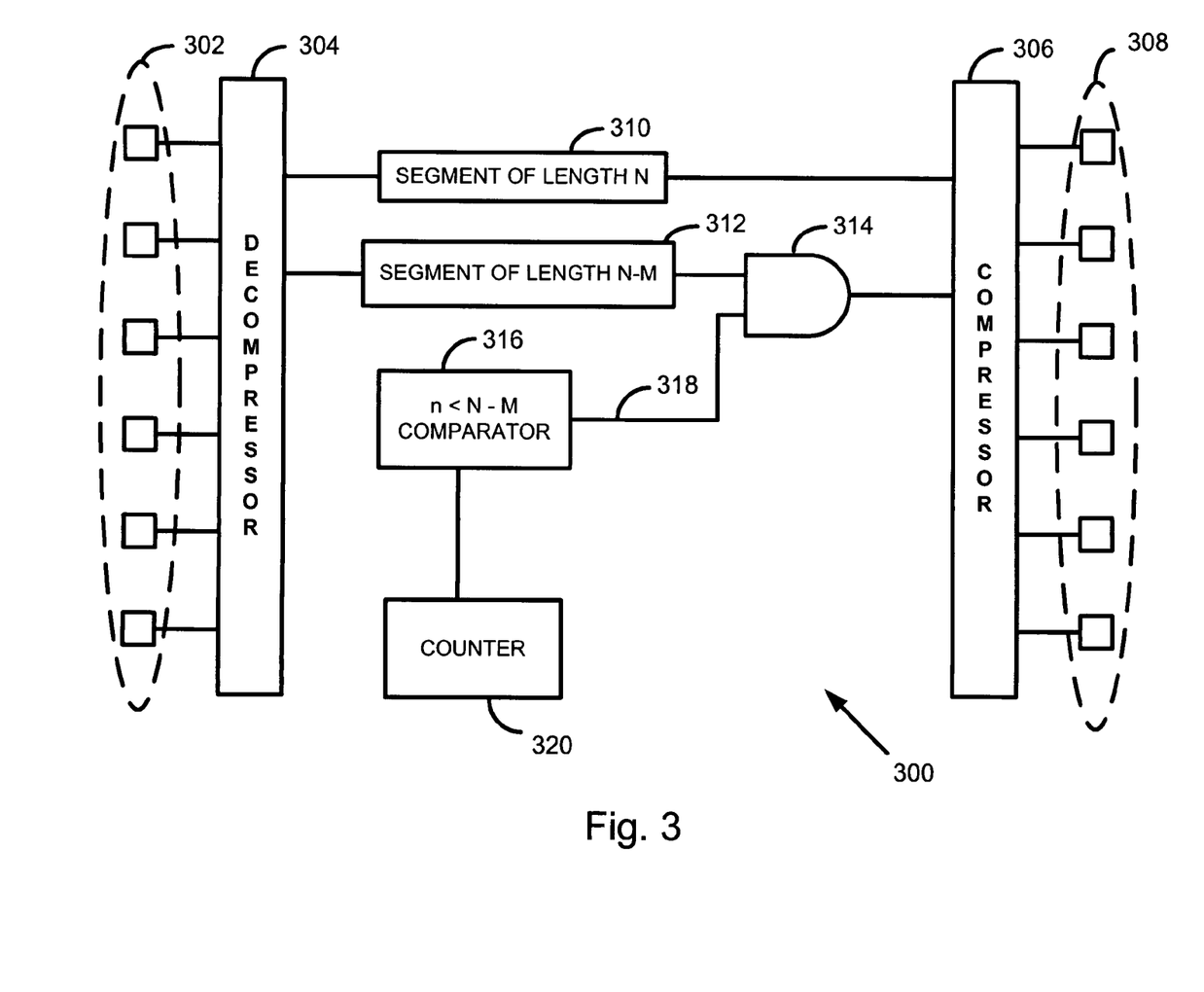
FIG. 3 displays a scan chain architecture with a single unbalanced scan chain segment.

FIG. 3 displays a scan chain architecture with a single unbalanced scan chain segment. FIG. 3 displays a scan chain architecture implemented in accordance with the teachings of the present invention. In the scan chain architecture 300, a decompressor 304 connects S1 scan channels shown as 302 from outside the scan chain architecture 300 to S2 scan segments positioned between the decompressor 304 and a compressor 306, where S2>S1. As scan data is shifted into the scan chain architecture 300, the decompressor 304 generates a larger number of outputs than shifted into the scan chain architecture 300. Likewise, the compressor 306 compresses the data shifted out of the scan segments and produces a result that determines the success or failure of the test. This result is shifted out of the scan chain architecture 300 on S3 scan channels 308, where S3<S2.

It should be appreciated that various modifications may be implemented and still remain within the scope of the present invention. In another embodiment of the present invention, an architecture in which S1=S2 may be implemented. In this case, the decompressor is degenerate. The decompressor connects each scan channel (S1) to one scan chain segment (S2). For example, the decompressor 304 connects S1 scan channels 302 from the outside world to S2 scan segments positioned between decompressor 304 and compressor 306, where S2=S1.

Positioned between the decompressor 304 and the compressor 306 is a scan segment of length N 310. It should be appreciated that the scan segment of length N 310 represents all of the scan segments that may occur between decompressor 304 and compressor 306 that are of length N. In addition to the scan segment of length N 310, there is at least one scan segment that is of length less than N. The scan segment that has a length that is less than N represents the unbalanced scan chain segment and for the purposes of discussion will be referred to as an unbalanced scan chain segment or as a short scan chain segment. For example, in one embodiment of the present invention, a segment of length N-M 312 is implemented. It should be appreciated that the teachings of the present invention may be implemented when there is one or more scan segments with a length that is less than or greater than N. Therefore, any embodiment, including unbalanced scan chain segments (i.e., unequal scan chain segments), is within the scope of the present invention.

To implement masking of the scan chain segments that have a length that is less than length N (i.e., 312), additional elements are provided in the scan chain architecture 300. As shown in FIG. 3, a logical gate, such as an AND gate 314, is positioned between the segment of length N-M 312 and the compressor 306. As such, the segment of length N-M 312 serves as an input to the AND gate 314. A comparator 316 is positioned as a second input to the AND gate 314. In one embodiment, the comparator 316 produces a control output (i.e., masking output or masking signal) to the AND gate 314 when n (i.e., the count) is equal to or greater than the segment of length N-M 312. The count n is generated by counter 320.

The comparator 316 can be implemented using a variety of different methods. In all cases, the comparator 316 produces an output with one value if the "count" input is less than the comparison value, and the opposite value if the count is equal to or greater than the comparison value.

In a first method, a fixed comparison value may be implemented. In this example, the length of the short scan chain is known in advance and logic gates that compare to this number (and only this number) are implemented. This approach may be implemented to conserve physical area.

In a second method, a programmable comparison value is loaded explicitly from the tester. In this method, the comparator 316 has a register in it that holds the comparison value and this register must be programmed by the tester before scan testing begins. Care must be taken not to disturb this register during the shifting process.

In a third method, a self-programming comparison value is implemented. As in the second method, the comparator 316 contains a register that stores the comparison value. However, in this method, a special "learning" control signal is supplied to the comparator 316. This signal is asserted and then a special "training pattern" is shifted into the scan chains on the chip. This results in the correct comparison value being loaded into the register. The "learning" signal is de-asserted and scan testing can begin.

During operation, in one embodiment of the present invention, the gate, such as 314, is positioned between the end of each short segment (i.e., 312) and the compressor 306. A control input 318 to the AND gate 314 is adjusted after N-M bits have been shifted out of the short segment so that M extra bits are masked. As a result, the compressor 306 receives zeros for M cycles.

During operation, several components operate to generate the controls signals. The first component is a counter 320. The counter 320 is capable of counting to N, where N is the number of flip-flops in the longest scan segment on the chip. The counter counts the number of bits associated with the segment of length N 310. In one embodiment, the counter 320 is automatically reset each time the chip is clocked in functional mode. For example, each time a scan chain pattern is shifted in to the scan chain architecture 300, the counter 320 begins at zero and counts the number of scan bits shifted into the scan chain architecture 300. After shifting is completed and the chip is placed in normal operation mode to perform the test, the counter 320 is reset to zero. Alternatively, the counter may count to N-M, for the smallest M on the chip, after which it holds its value until reset.

A comparator (i.e., 316) and a logic gate (i.e., 314) are also presented. In one embodiment, the comparator (i.e., 316) receives input from the counter 320 and provides an output to the AND gate (i.e., 314) to mask bits in scan chain segments with less than N bits (i.e., 312). The comparator (i.e., 316) and the counter 320 combine to form the logic that performs N−M comparisons. When the value of the counter 320 reaches N−M, the control input (318) is toggled; this masks the end of the segment of length N−M 312.

In one embodiment, at the beginning of a test, the counter 320 is set to zero and the control input 318 will enable the processing of data from all segments during the first N−M shifts (i.e., segment of length N 310 as well as segment of length N−M 312). The control signal (i.e., signal on control input 318) is then toggled to mask the output of the short segment (i.e., segment of length N−M 312). A further M shifts are performed to complete the observation of the longer segments and to finish shifting the new pattern. During the shifts, the compressor 306 receives zeros at the end of the short segment (i.e., segment of length N−M 312). Once the scan chains have been processed, the counter 320 is reset and the process can begin again for the next pattern.

A number of variations may be implemented using the scan chain architecture 300 or a variation of the scan chain architecture 300. A number of adaptive and/or learning comparators may be implemented in scan chain architecture 300. For example, comparator 316 may be implemented with a minimal gate configuration that would occupy the smallest possible area on the chip. To accomplish this, the comparator 316 may be implemented with minimal gates for comparison of a fixed number.

In a second embodiment, comparator 316 may be implemented with an N-bit input for the value to be compared. The N-bit input may be wired to the correct value (a fixed set of 1s and/or 0s) before the chip is sent for fabrication. In a third embodiment, comparator 316 may be implemented with an N-bit input for the value to be compared against. The N-bit inputs are then connected to a user register in the Test Access Port (TAP) or in some other register on chip that is protected from disturbance during the process of scan shifting. Pins on the chip may also be used for this purpose.

In a fourth embodiment, comparators that program themselves may be implemented. The comparators may program themselves with the count during a learning phase or training sequence. Implementing comparators that program themselves would require a particular procedure to prepare the chip for testing. In one embodiment, a preparation process may be implemented as follows:

A. Power up the chip. All the flip-flops are assumed to hold random values.
B. Shift a sufficient number of zeros to be certain that all the flip-flops contain zero.
C. Assert a "learning mode" signal, either directly from the outside world or through a TAP.
D. Shift in a pattern of all ones. When each comparator sees a value of one appear at the end of the segment it is associated with, it stores the current value of the counter as the value to compare against, thus completing the training.

Figure 4:
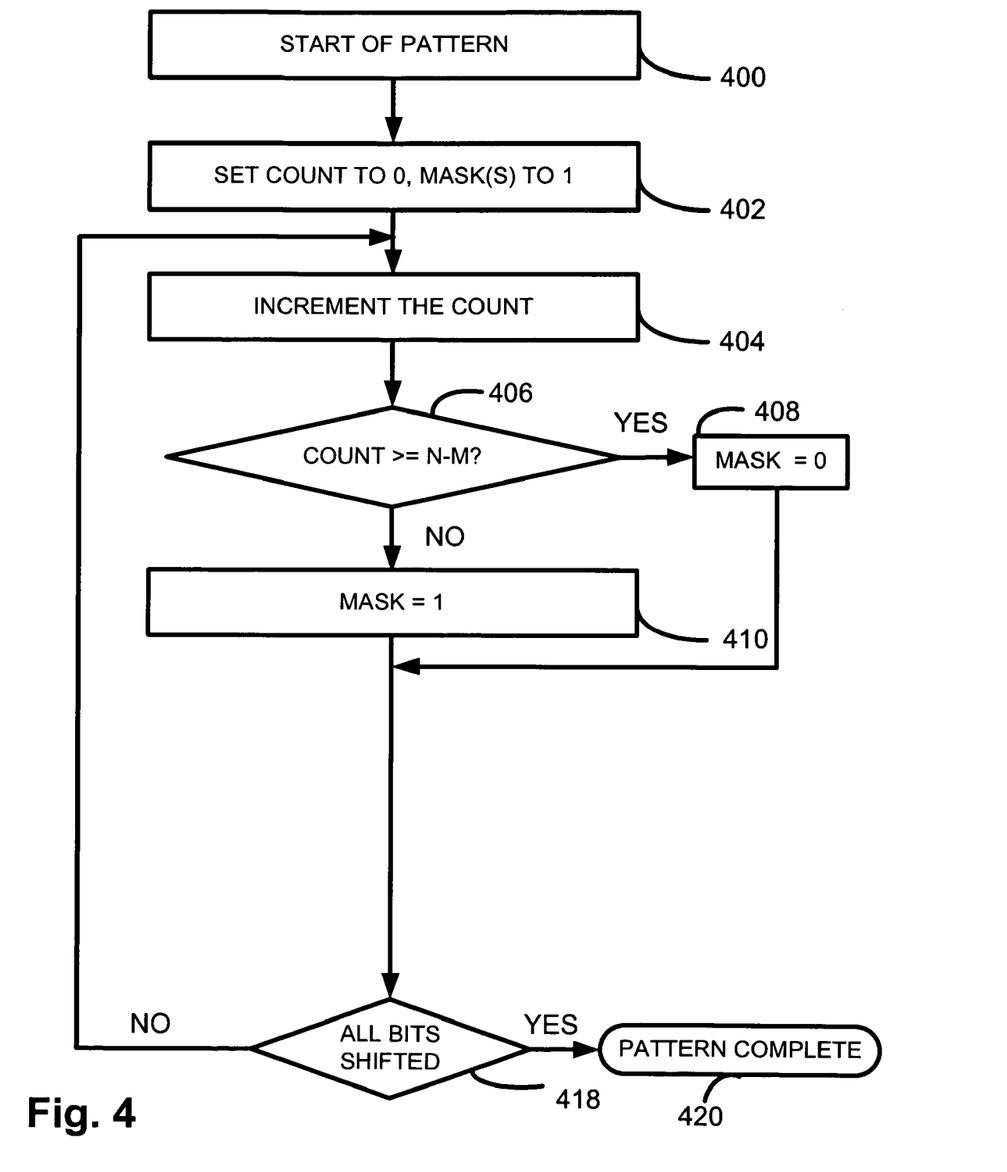
FIG. 4 displays a flow diagram of a method of operating a scan chain architecture including a single unbalanced scan chain segment.

FIG. 4 displays a flow diagram of a method of operating a scan chain architecture including a single unbalanced scan chain segment. FIG. 4 displays a flow diagram detailing a method implemented in accordance with the teachings of the present invention. FIG. 4 will be discussed in conjunction with FIG. 3. At step 400, the scan chain pattern starts. At step 402, the counter (i.e., count) is set to 0 and the comparators (i.e., masks) are set to 1. It should be appreciated that setting the mask signal to one allows the data at the end of the chain to be propagated to the compressor. For example, in FIG. 3, counter 320 (i.e., count) is set to zero and comparator 316 is set to 1. As the scan pattern is processed, the counter 320 (i.e., count) is incremented as stated at 404, once per scan bit shifted.

A test is performed to determine if the count on the counter 320 is greater than or equal to N−M as stated at 406. If the count on the counter 320 is greater or equal to N−M, then the comparator 316 (i.e., MASK) equals 0 as stated at 408. If the count on the counter 320 is not greater or equal to N−M, then the comparator 316 (i.e., MASK=1) equals 1 as stated at 410.

A test is then made at 418 to determine if all of the bits in the bit pattern have been shifted. If all of the bits in the bit pattern have not been shifted as tested at 418, then the count in the counter 320 is incremented and the subsequent portions of the method detailed in FIG. 4 are performed again. If all of the bits have been shifted as stated in 420, the pattern is complete as stated at 420.

Figure 5:
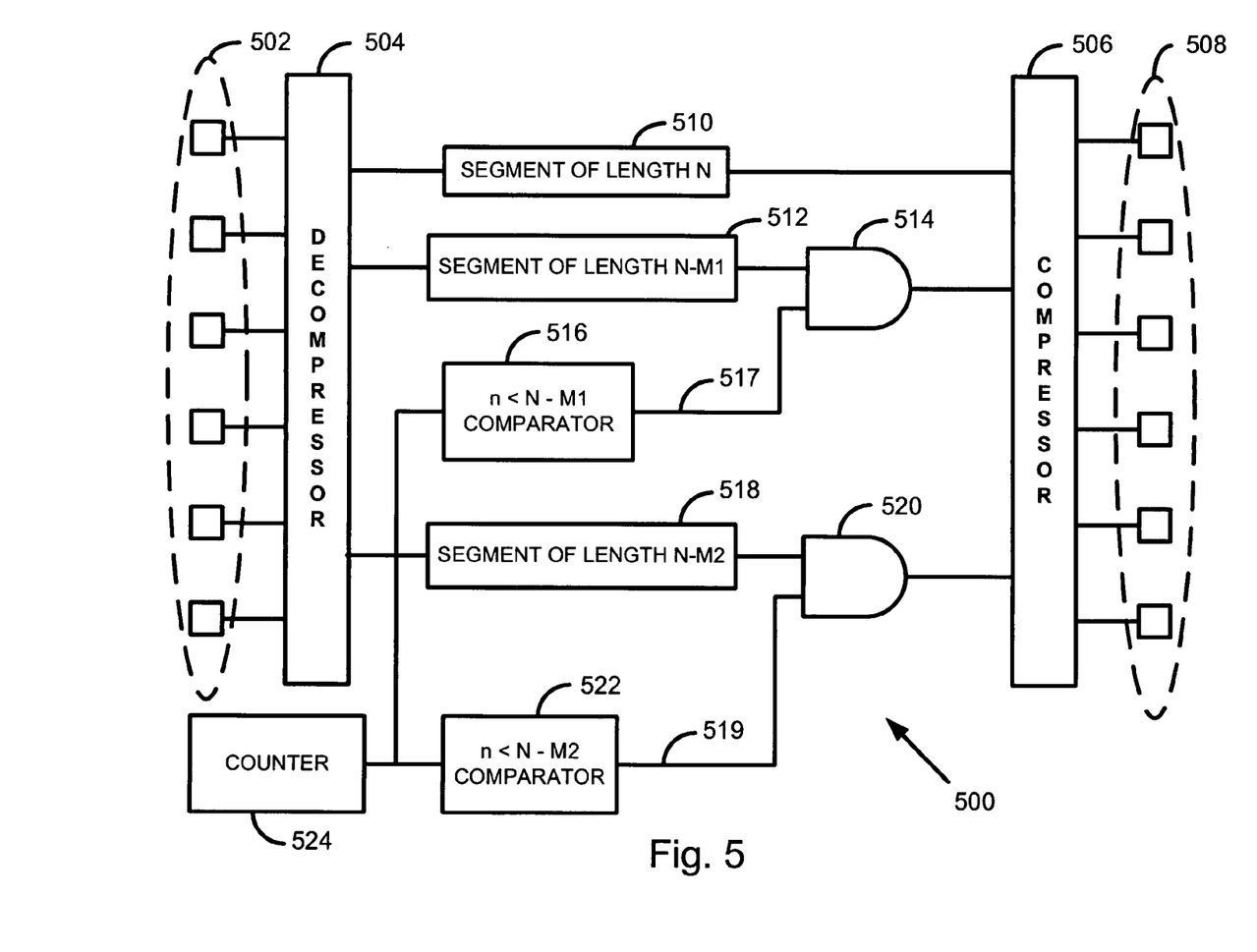
FIG. 5 displays a scan chain architecture with multiple unbalanced scan chain segments.

FIG. 5 displays a scan chain architecture with multiple unbalanced scan chain segments. FIG. 5 displays a scan chain architecture implemented in accordance with the teachings of the present invention. In the scan chain architecture 500, a decompressor 504 connects S1 scan channels shown as 502 from outside the scan chain architecture 500 to S4 scan segments positioned between the decompressor 504 and a compressor 506. As scan data is shifted into the scan chain architecture 500, the decompressor 504 generates a larger number of outputs than shifted into the scan chain architecture 500. Likewise, the compressor 506 compresses the data shifted out of the scan segments and produces a result that determines the success or failure of the test. The compressor 506 then provides an interface to scan channels 508.

Positioned between the decompressor 504 and the compressor 506 is a scan segment of length N 510. It should be appreciated that the scan segment of length N 510 represents all of the scan segments that may occur between decompressor 504 and compressor 506 that are of length N. In addition to the scan segment of length N 510, there is at least one scan segment that is less than N. The scan segment that has a length that is less than N represents the unbalanced scan chain segment. For example, in one embodiment of the present invention, a segment of length N−M1 512 and a segment of length N−M2 518 are shown. It should be appreciated that the teachings of the present invention may be implemented when there is one or more scan segments with a length that is less than or greater than N. Therefore, any embodiment, in which there is an unbalanced scan chain segment (i.e., unequal scan chain segments), is within the scope of the present invention.

To implement masking of the scan chain segments that have a length that is less than length N (i.e., 512 and 518) additional elements are provided in the scan chain architecture 500. As shown in FIG. 5, a logical gate, such as an AND gate 514, is positioned between the segment of length N−M1 512 and the compressor 506. As such, the segment of length N−M1 512 serves as an input to the AND gate 514. A comparator 516 is positioned as a second input to the AND gate 514. In one embodiment, the comparator 516 produces a control output (i.e., masking output or masking signal) to the AND gate 514 when n (i.e., the count) is equal to or greater than the segment of length N−M1 512.

A similar configuration is implemented in association with the segment of length N−M2 518. A logical gate, such as an AND gate 520, is positioned between the segment of length N−M2 518 and the compressor 506. As such, the segment of length N−M2 518 serves as an input to the AND gate 520. A comparator 522 is positioned as a second input to the AND gate 520. In one embodiment, the comparator 522 produces an output to the AND gate 520 when n (i.e., the count) is equal to or greater than the segment of length N–M2 522. A counter 524 provides input to the comparator 516 and the comparator 522.

During operation, in one embodiment of the present invention, the gates, such as 514 and/or 520, are positioned between the end of each short segment (i.e., 512, 518) and the compressor 506. As used in association with FIG. 5, the value "M" should be taken to be any relevant value of M. For example, in FIG. 5 there is a chain of length N–M1 and another chain of length N–M2 shown. The value "M" may refer to either M1 or to M2, depending on which comparator and gate is being referenced. A control input to the gate (517, 519) is adjusted after N–M bits have been shifted out of the short segment so that M extra bits are masked. As a result, the compressor 506 receives zeros for M cycles.

During operation, several components operate to generate the control signals. The first component is a counter 524. The counter 524 is capable of counting to N, where N is the number of flip-flops in the longest scan segment on the chip. The counter counts the number of bits associated with the segment of length N 510. In one embodiment, the counter 524 is automatically reset each time the chip is clocked in functional mode. For example, each time a scan chain pattern is shifted in to the scan chain architecture 500, the counter 524 begins at zero and counts the number of scan bits shifted into the scan chain architecture 500. After shifting is completed and the chip is placed in normal operation mode, the counter 524 is reset to zero.

A comparator (i.e., 516, 522) and a logic gate (i.e., 514, 520) are also implemented. In one embodiment, the comparator (i.e., 516, 522) receives input from the counter 524 and provides an output to the logic gate (i.e., 514, 520) to mask bits in scan chain segments with less than N bits (i.e., 512, 518). The comparator (i.e., 516, 522) and the counter 524 combine to form the logic that performs N–M comparisons. When the value of the counter 524 reaches N–M, the control line (517, 519) is toggled; this masks the end of the segment of length N–M1 512 and the segment of length N–M2 518. When multiple control signals are needed, gates (i.e., 514, 520) and comparators (516, 522) are added to perform multiple different comparison operations on the value of the counter 524. It should be appreciated that a single value or multiple values (i.e., if multiple control signals are needed) of N–M may be hard-coded in the chip or loaded into registers as an initialization step prior to the start of the scan test. Alternatively, the counter may count to N–M, for the smallest M on the chip, after which it holds its value until reset.

In one embodiment, at the beginning of a test, the counter 524 is set to zero and the control line (517, 519) will enable the processing of the first N–M bits of all scan segments. After M1 shifts, the control signal (i.e., 517) is then toggled to mask the output of the short segment (i.e., segment of length N–M1 512). Also, after M2 shifts, the control signal (i.e., 519) is then toggled to mask the output of the short segment (i.e. segment of length N–M2 518). A further M shifts are performed to complete the observation of the longer segments and to finish shifting the new pattern. During the shifts, the compressor 506 receives zeros at the end of the short segment (i.e., segment of length N–M1 512 and segment of length N–M2 518). Once the scan chains have been processed, the counter 524 is reset and the process can begin again for the next pattern.

In accordance with the teachings of the present invention, there are two variations that describe the relationship between the two short scan chains. In the first variation, N–M1<N–M2. In the second variation, M1=M2. In one embodiment, if there are two short chains of length N–M1 and N–M2, we can assume that N–M1<N–M2 (i.e., M2<M1. The N–M1 chain is shorter than the N–M2 chain). With this assumption, first, N–M1 shifts are performed and the outputs of all chains are allowed to pass to the compressor 506. At that time, the mask signal for the N–M1 chain is asserted and the compressor 506 will only see zeros from that chain. Additional M1-M2 shifts are performed (i.e., for a total of N–M2), at which time the mask for the N–M2 chain is asserted causing the compressor 506 to see only zeros from that chain. For the remaining M2 shifts, the compressor 506 sees zeros from both short chains, but receives the test results for all full-length chains.

In a second embodiment, M1=M2. In this variation, a single comparator is required, but two masking gates, one for each short chain, are required. The sequence is the same as for a single short segment, except after N–M shifts, the outputs of both short chains are masked off and the compressor 506 sees only zeros for those chains. This allows the sharing of the comparator logic. Otherwise, it is simply a degenerate case of the two short-chains example.

It should be appreciated that both variations of the two short scanchain segments can be combined to handle any number of short scan chains. For each short length (N–M$_i$), a comparator is required. For each chain of that length, a masking gate connected to the mask signal from that comparator is required.

A number of variations may be implemented using the scan chain architecture 500 or a variation of the scan chain architecture 500. A number of adaptive and/or learning comparators may be implemented in scan chain architecture 500. For example, comparator 516 and/or 522 may be implemented with a minimal gate configuration that would occupy the smallest possible area on the chip. To accomplish this, the comparator 516 and/or 522 may be implemented with minimal gates for comparison of a fixed number.

In a second embodiment, comparator 516 and/or 522 may be implemented with an N-bit input for the value to be compared. The N-bit input may be wired to the correct value (a fixed set of 1s and/or 0s) before the chip is sent for fabrication. In a third embodiment, comparator 516 and/or 522 may be implemented with an N-bit input for the value to be compared against. The N-bit inputs are then connected to user registers in the TAP or elsewhere on the chip that are protected during scan shifting. Pins on the chip may also be used for this purpose.

In a fourth embodiment, comparators that program themselves may be implemented. The comparators may program themselves with the count during a learning phase or training sequence. Implementing comparators that program themselves would require a particular procedure to prepare the chip for testing. In one embodiment, a preparation process may be implemented as follows:

A. Power up the chip. All the flops are assumed to hold random values.
B. Shift a sufficient number of zeros to be certain that all flops contain zero.
C. Assert a "learning mode" signal, either directly from the outside world or through a TAP.
D. Shift in a pattern of all ones. When each comparator sees a value of one appear at the end of the segment it is associated with, it stores the current value of the counter as the value to compare against.

Figure 6:
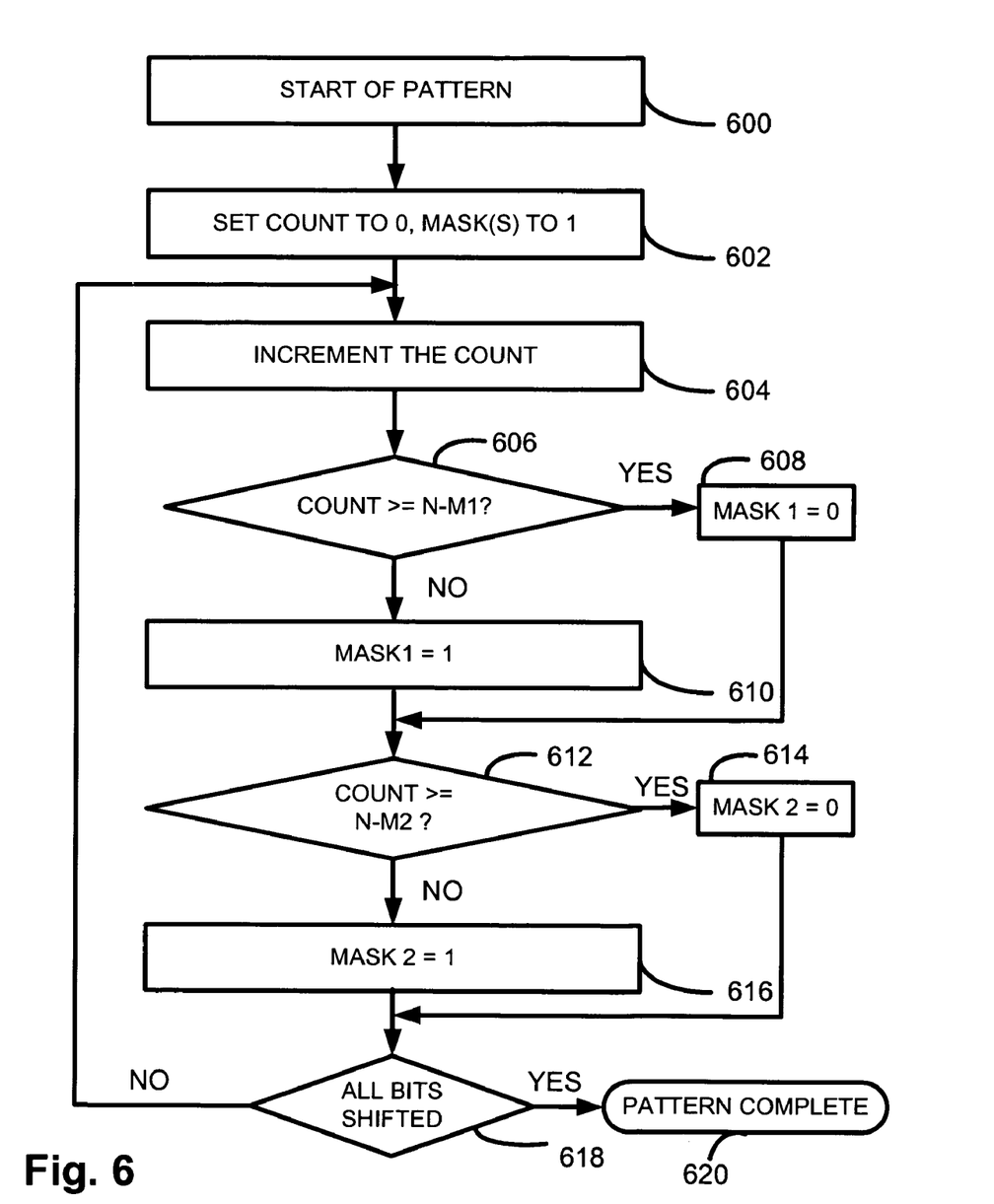
FIG. 6 displays a flow diagram of a method of operating a scan chain architecture including multiple unbalanced scan chain segments.

FIG. 6 displays a flow diagram of a method of operating a scan chain architecture including multiple unbalanced scan chain segments. FIG. 6 displays a flow diagram detailing a method implemented in accordance with the teachings of the present invention. FIG. 6 will be discussed in conjunction with FIG. 5. At step 600, the scan chain pattern starts. At step 602, the counter (i.e., count) is set to 0 and the comparators (i.e., masks) are set to 1. It should be appreciated that setting the mask signal to one allows the data at the end of the chain to be propagated to the compressor. For example, in FIG. 5, counter 524 (i.e., count) is set to zero and comparators 516 and 522 are set to 1. As the scan pattern is processed, the counter 524 (i.e., count) is incremented as stated at 604, once per bit shifted.

A test is performed to determine if the count on the counter 524 is greater than or equal to N-M1 as stated at 606. If the count on the counter 524 is greater or equal to N-M1, then the comparator 516 (i.e., MASK 1) equals 0 as stated at 608. If the count on the counter 524 is not greater or equal to N-M1, then the comparator 516 (i.e., MASK 1) equals 1 as stated at 610. A test is then performed by the second comparator 522. A test is performed to determine if the count on the counter 524 is greater than or equal to N-M2 as stated at 612. If the count on the counter 524 is greater or equal to N-M2, then the comparator 522 (i.e., MASK 2) equals 0 as stated at 614. If the count on the counter 524 is not greater or equal to N-M2, then the comparator 522 (i.e., MASK 2) equals 1 as stated at 616. In accordance with one embodiment of the present invention, both of the comparisons (and the consequent changes in the state of the mask signals) occur simultaneously.

A test is then made at 618 to determine if all of the bits in the bit pattern have been shifted. If all of the bits in the bit pattern have not been shifted as tested at 618, then the count in the counter 524 is incremented and the previous steps of the method detailed in FIG. 6 are performed again. If all of the bits have been shifted as stated in 618, the pattern is complete as stated at 620.

Figure 7:
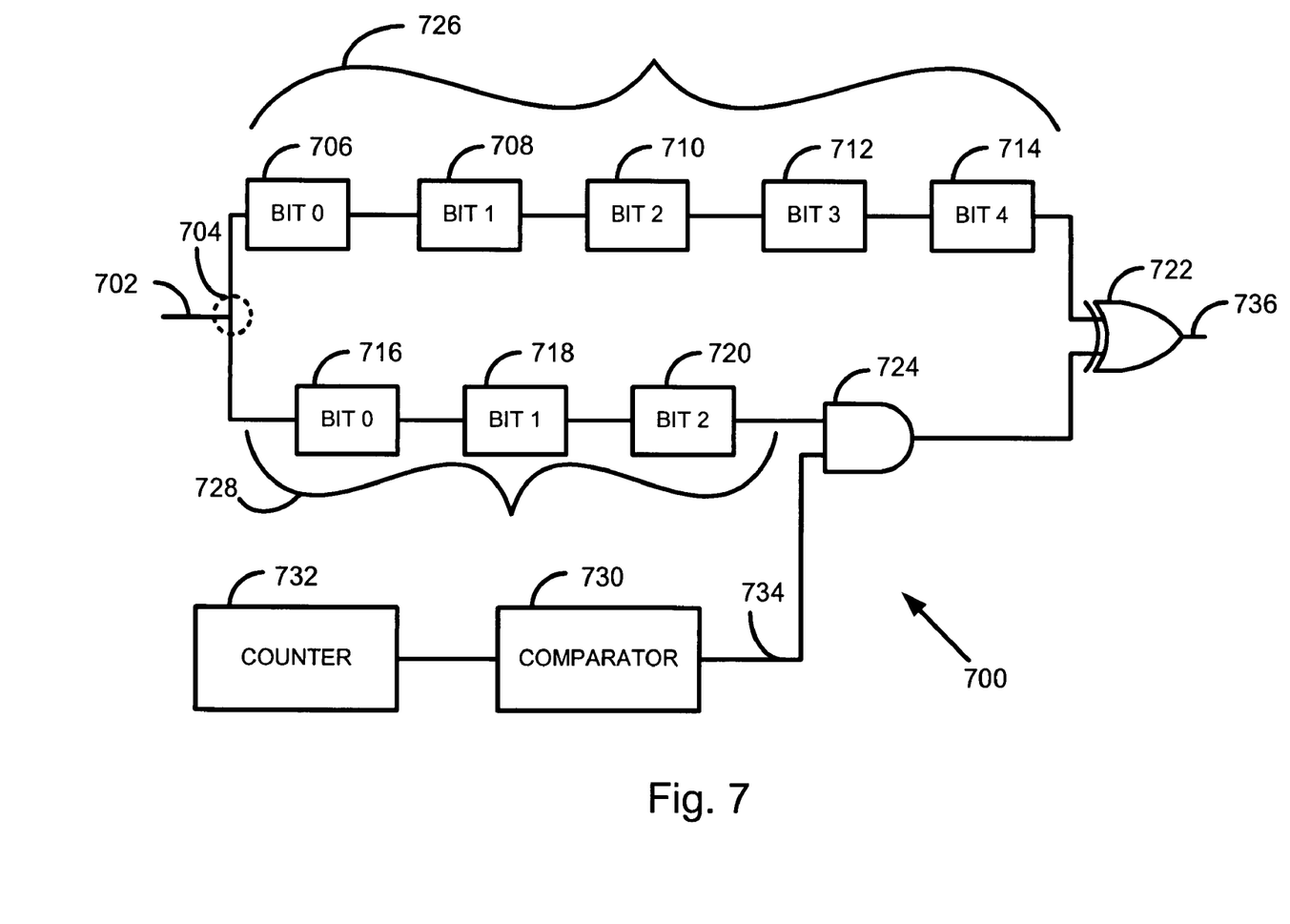
FIG. 7 displays a specific implementation of an unbalanced scan chain architecture implemented in accordance with the teachings of the present invention.

FIG. 7 displays an unbalanced scan chain architecture implemented in accordance with the teachings of the present invention. In FIG. 7, an incoming pattern (input) is applied at the scan data input shown as 702. A simple decompressor (a fan-out) is shown as 704. Scan chain segments 726 and 728 are shown. Scan chain segment 726 includes a 5 flip-flop scan chain. Scan chain segment 726 includes Bit position 0 shown as 706, Bit position 1 shown as 708, Bit position 2 shown as 710, Bit position 3 shown as 712, and Bit position 4 shown as 714. Scan chain segment 728 includes a 3 flip-flop scan chain. Scan chain segment 728 includes Bit position 0 shown as 716, Bit position 1 shown as 718, and Bit position 2 shown as 720.

A compressor is implemented with XOR gate 722, which then provides an output 736. A gate (i.e., such as an AND gate) 724 is positioned between Bit position 2 (720) and the XOR gate 722. A comparator 730 provides input to the AND gate 724. A counter 732 provides input to the comparator 730. The scan chain architecture 700 represents an unbalanced scan chain architecture since the scan chain segment shown as 726 has a different length (i.e., 5 flip-flops) than the length (i.e., 3 flip-flops) of the scan chain segment 728.

In the scan chain architecture 700 demonstrated in FIG. 7, data is shifted into the scan chain architecture 700 at input 702. The data is then separated into individual scan chains at the fanout 704. Scan chain architecture 700 has N bits (i.e., 5 flip-flops) and scan chain segment 728 has N-M flip-flops (i.e., N-M=3 so M=2). As a result, the scan chain segment 728 is shorter than the scan chain segment 726 by M, which denotes the difference in lengths (i.e., in this example M=2).

In a conventional method, a bit stored in Bit position 4 (714) and a bit stored in Bit position 2 (720) are combined in the XOR gate 722 after the first shift. A bit stored in Bit position 3 (712) and a bit stored in Bit position 1 (718) are combined in the XOR gate 722 after the second shift. A bit stored in Bit position 2 (710) and a bit stored in Bit position 0 (716) are combined in the XOR gate 722 after the third shift.

Prior to shifting the bits, the counter 732 is set to zero. As each shift occurs, the counter 732 increases. The comparator 730 compares a count generated by the counter 732 with N-M. Once the count is equal to or greater than N-M, the comparator 730 asserts a control signal on control line 734. Asserting the control signal on control line 734 causes the AND gate 724 to mask any bits shifted after the first three. Theoretically, more than 7 bits could be shifted into this architecture and the mask would continue to block the output at the end of the short segment. As a result, the XOR gate 722 receives zeros for two clock cycles.

Table II given below provides a tabular form of one embodiment of the method of the present invention. The data in Table II is associated with the scan chain architecture 700 detailed in FIG. 7. In Table II, PN represents a bit of the next incoming pattern. RN,M is the result of the previous test in bit M of scan chain N. It should be noted that in the example provided in Table II, the output at time 5 is not relevant until after the next pattern is applied. In addition, note that two fewer shifts (i.e., than in Table I) are required with the masking to achieve the same output as when padding is used.

TABLE II

|  | TIME | | | | | |
|---|---|---|---|---|---|---|
|  | 0 | 1 | 2 | 3 | 4 | 5 |
| Chain 1 | | | | | | |
| Bit 0 | R1,0 | P4 | P3 | P2 | P1 | P0 |
| Bit 1 | R1,1 | R1,0 | P4 | P3 | P2 | P1 |
| Bit 2 | R1,2 | R1,1 | R1,0 | P4 | P3 | P2 |
| Bit 3 | R1,3 | R1,2 | R1,1 | R1,0 | P4 | P3 |
| Bit 4 | R1,4 | R1,3 | R1,2 | R1,1 | R1,0 | P4 |
| Chain 2 | | | | | | |
| Bit 0 | R2,0 | P4 | P3 | P2 | P1 | P0 |
| Bit 1 | R2,1 | R2,0 | P4 | P3 | P2 | P1 |
| Bit 2 | R2,2 | R2,1 | R2,0 | P4 | P3 | P2 |
| Count | 0 | 1 | 2 | 3 | 4 | |
| Mask | 1 | 1 | 1 | 0 | 0 | |
| Output w/o masking | R1,4⊕R2,2 | R1,3⊕R2,1 | R1,2⊕R2,0 | R1,1⊕P4 | R1,0⊕P3 | |
| Output w/ masking | R1,4⊕R2,2 | R1,3⊕R2,1 | R1,2⊕R2,0 | R1,1⊕0 | R1,0⊕0 | |

In Table II, a line "output with masking" and a line "output without masking" are presented. The line "output without masking" is included to illustrate the problem the invention is intended to solve. Specifically, without the masking, the result of the previous test is dependent on the next incoming pattern (i.e., at time 3 and 4, the incoming data P4 and P3 appear in the description of the output). The line "output with masking" details the outcome using the method and apparatus of the present invention (i.e., at time 3 and 4, the incoming data P4 and P3 do not appear in the description of the output as a result of implementing the method and apparatus of the present invention).

Referring to Table II, at time 0, a control line is asserted at times 0, 1, and 2. At times 3 and 4, the mask is toggled. The output without masking at time 3 is shown as R1,1⊕P4, and the output without masking at time 4 is R1,0⊕P3. The output with masking at time 3 is R1,1⊕ 0 and the output with masking at time 4 is R1,0⊕ 0.

Figure 8:
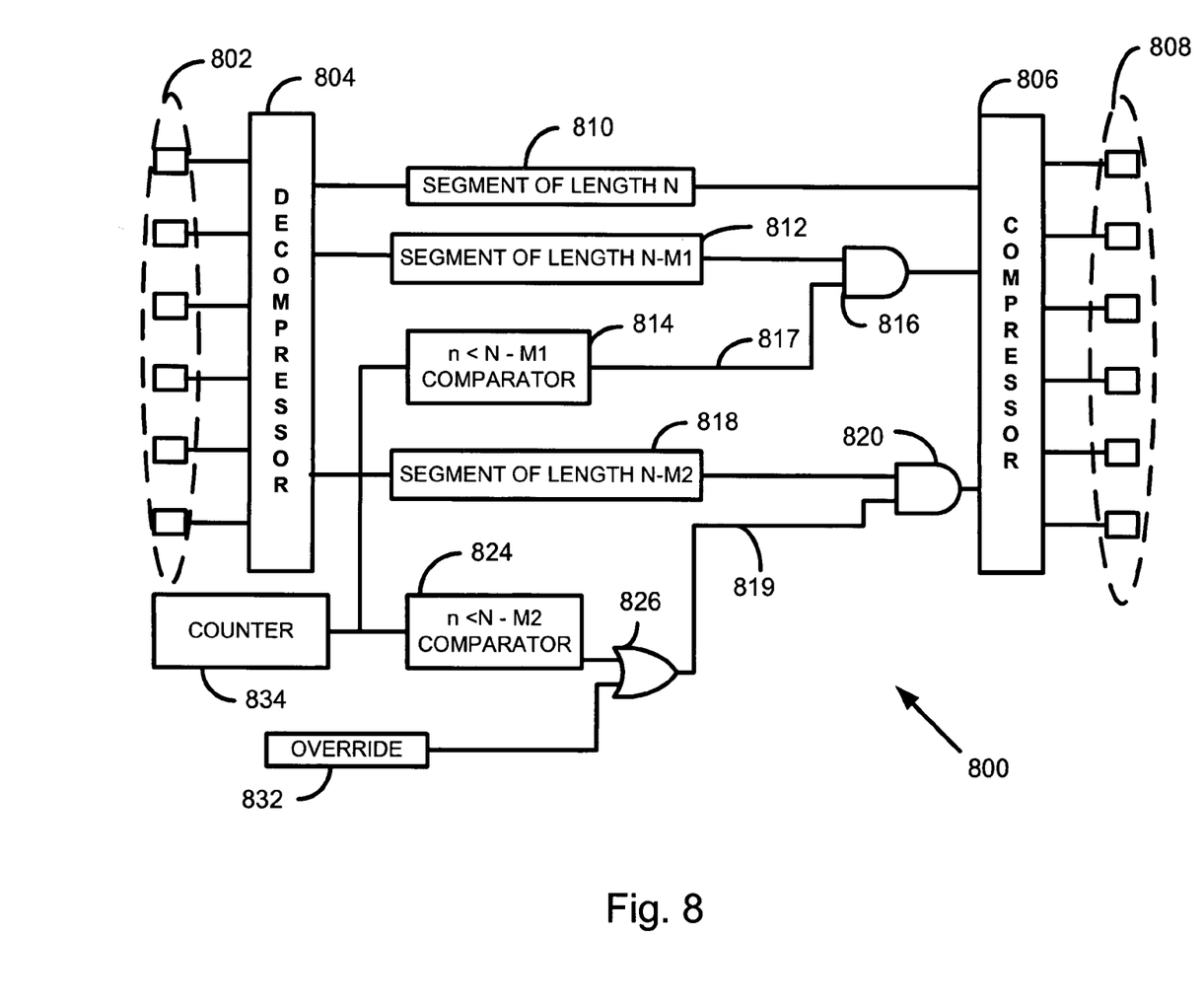
FIG. 8 displays an alternate embodiment of a scan chain architecture with multiple unbalanced scan chain segments and an override circuit.

FIG. 8 displays an alternate embodiment of a scan chain architecture with multiple unbalanced scan chain segments and an override circuit. FIG. 8 displays a scan chain architecture implemented in accordance with the teachings of the present invention. A decompressor 804 connects S1 scan channels shown as 802 from outside the scan chain architecture 800 to S2 scan segments positioned between the decompressor 804 and compressor 806, where S2>S1. As scan data is shifted into the scan chain architecture 800, the decompressor 804 decompresses the scan data. The compressor 806 compresses the data shifted out of the scan segments and produces a result that can be examined to determine the success or failure of the test. The result is shifted out of the scan chain architecture 800 on S3 scan channels 808, where S3<S2.

Positioned between the decompressor 804 and the compressor 806 are scan segments of length N 810. The scan segments of length N 810 represent all of the full-length (i.e., of length N) scan segments that may occur between decompressor 804 and compressor 806. In addition to the scan segments of length N (810), there is at least one scan segment that is less than N. These scan segments that have a length that is less than N represent the unbalanced scan chain segments. For example, in one embodiment of the present invention, a segment of length N–M1 (812) and a scan segment of Length N–M2 (818) are shown. It should be appreciated that the teachings of the present invention may be implemented with one scan chain segment with a length that is less than or shorter than N or with more than two scan chain segments of lengths less than N.

To facilitate masking of the scan chain segments that have a length that is less than length N (i.e., 812 and 818), additional elements are implemented in the scan chain architecture 800. As shown in FIG. 8, a logical gate, such as a AND gate 816, is positioned between the segment of length N–M1 (812) and the compressor 806. As such, the segment of length N–M1 (812) serves as an input to the AND gate 816. A comparator 814 is positioned as a second input to the AND gate 816. In one embodiment, the comparator 814 produces a control output (i.e., on control line 817) to the AND gate 816 when n (i.e., the count) is equal to or greater than the segment of length N–M1 (812).

A similar configuration is implemented in association with the segment of length N–M2 (818). A logical gate, such as an AND gate 820, is positioned between the segment of length N–M2 (818) and the compressor 806. As such, the segment of length N–M2 (818) serves as an input to the AND gate 820.

An OR gate 826 provides a second input to the AND gate 820. The OR gate 826 receives two inputs. A comparator 824 is positioned as a first input to the OR gate 826. In one embodiment, the comparator 824 produces an output to the OR gate 826 when n (i.e., the count) is equal to or greater than the segment of length N–M2 (818). An override circuit 832 provides a second input to OR gate 826. A counter 834 provides input to the comparator 814 and comparator 824. It should be appreciated that although the override circuit 832 is shown in association with comparator 824, in another embodiment of the present invention, an override circuit 832 may be associated with any comparator or any combination of override circuits may be associated with a combination of comparators.

During operation, in one embodiment of the present invention, the gates, such as 816 and/or 820, operate between the end of each short segment (i.e, 812, 818) and the compressor 806. A control input (817, 819) to the gate (816, 820) is adjusted after N–M (i.e., M1 & M2) bits have been shifted out of the short segment so that M extra bits are masked. As a result, the compressor 806 receives zeros for M cycles, simulating the effect of padding bits without the bits having to be supplied by a tester.

Additional components are implemented to generate the required control signals. In one embodiment, the additional components include comparators (i.e., 814, 824), logic gates (i.e., 816, 820, 826), and an override circuit 832. In one embodiment, the comparators (i.e., 814, 824) receive input from the counter 834 and provide an output, which mask bits in scan segments with less than N bits (i.e., 812, 818). The comparators (i.e., 814, 824) and the logic gates (i.e., 816, 820, 826) combine to form the logic that performs a count of greater than N–M comparisons. When the value of the counter 834 reaches N–M, the control line is toggled. Toggling the control line masks the end of the short scan segments (812, 818).

The override circuit 832 is implemented to prevent automatic masking. For example, if the override circuit 832 is set to 1, then based on the logical gates (i.e., 820, 826), the OR gate will output a 1, setting the AND gate to pass the data from the end of the short segment to the compressor. As a result, the override circuit 832 may be implemented to override (i.e., stop) automatic masking.

Thus, the present invention has been described herein with reference to a particular embodiment for a particular application. Those having ordinary skills in the art and access to the present teachings will recognize additional modifications, applications, and embodiments within the scope thereof.

It is, therefore, intended by the appended claims to cover any and all such applications, modifications, and embodiments within the scope of the present invention.

What is claimed is:

1. A method of performing scan test in a scan test architecture including at least one unbalanced scan chain including flip-flops, the method comprising the steps of:
   incrementing a count;
   comparing the count to a value representing the flip-flops in the at least one unbalanced scan chain; and
   performing masking in response to comparing the count to the value representing the flip-flops in the at least one unbalanced scan chain.

2. A method of performing scan test as set forth in claim 1, wherein the step of comparing is performed using a fixed comparator value.

3. A method of performing scan test as set forth in claim 1, wherein the step of comparing is performed using a programmable comparator value.

4. A method of performing scan test as set forth in claim 1, wherein the step of comparing is performed using a learned comparator value.

5. A method of performing scan test as set forth in claim 1, wherein the step of masking is performed when the count equals the value.

6. A method of performing scan test as set forth in claim 1, wherein the at least one unbalanced scan chain includes at least two unbalanced scan chains and wherein the step of comparing is performed on each of the at least two unbalanced scan chains.

7. A method of performing scan test as set forth in claim 1, wherein the at least one unbalanced scan chain includes at least two unbalanced scan chains and wherein the step of masking is performed on each of the at least two unbalanced scan chains.

8. A method of performing scan test as set forth in claim 1, wherein zeros are generated in response to the step of masking.

9. A method of performing scan test as set forth in claim 1, wherein the step of masking further comprises the step of generating zeros from the at least one unbalanced scan chain.

10. A scan test system, comprising:
an unbalanced scan chain segment including flip-flops storing a test pattern;
a counter generating a count;
a comparator coupled to the counter and generating a comparator output in response to comparing the count to a value associated with the flip-flops; and
a gate coupled to the unbalanced scan chain segment and coupled to the comparator, the gate generating an output in response to the test pattern and in response to the comparator output.

11. A scan test system as set forth in claim 10, wherein the gate is an AND gate.

12. A scan test system as set forth in claim 10, further comprising an override system capable of overriding the first comparator.

13. A scan test system as set forth in claim 10, wherein the value associated with the flip-flops equals the number of flip-flops.

14. A system comprising:
a decompressor generating a test pattern;
a first unbalanced scan chain segment including first flip-flops, the first unbalanced scan chain segment coupled to the decompressor and storing first bits in response to the decompressor generating the test pattern;
a counter generating a count;
a first comparator coupled to the counter and generating a first comparator signal by comparing the count to a value representing the first flip-flops;
a first gate coupled to the first unbalanced scan chain segment and coupled to the first comparator, the first gate generating a first output in response to the first comparator signal; and
a compressor coupled to the first gate and generating a compressor output in response to the first output.

15. A system as set forth in claim 14, further comprising:
a second unbalanced scan chain segment including second flip-flops, the second unbalanced scan chain segment coupled to the decompressor and storing second bits in response to the decompressor generating the test pattern;
a second comparator coupled to the counter and generating a second comparator signal by comparing the count to a value representing the second flip-flops;
a second gate coupled to the second unbalanced scan chain segment and coupled to the second comparator, the second gate generating a second output in response to the second comparator signal; and
the compressor coupled to the second gate and generating the compressor output in response to the first output and in response to the second output.

* * * * *